United States Patent [19]

Mizuno

[11] Patent Number: 4,815,981

[45] Date of Patent: Mar. 28, 1989

[54] FLEXIBLE PRINTED CIRCUIT BOARD TERMINAL STRUCTURE

[75] Inventor: Shinji Mizuno, Kanagawa, Japan

[73] Assignee: Teikoku Tsushin Kogyo Co., Ltd., Kanagawa, Japan

[21] Appl. No.: 73,826

[22] Filed: Jul. 15, 1987

[30] Foreign Application Priority Data

Dec. 22, 1986 [JP] Japan .................. 61-305904

[51] Int. Cl.$^4$ .............................................. H01R 9/09
[52] U.S. Cl. ........................................ 439/77; 439/876
[58] Field of Search ......................... 439/77, 83–85, 439/874, 876, 932, 936

[56] References Cited

U.S. PATENT DOCUMENTS

| 3,762,946 | 10/1973 | Stow et al. | 439/77 |
| 4,188,714 | 2/1980 | Jean | 439/77 |
| 4,357,750 | 11/1982 | Ostman | 439/77 |
| 4,550,357 | 10/1985 | Matsumoto | 361/398 |
| 4,626,961 | 12/1986 | Ono et al. | 361/398 |

FOREIGN PATENT DOCUMENTS

| 0148157 | 7/1985 | European Pat. Off. | 439/77 |
| 13976 | 1/1980 | Japan | 439/77 |
| 2130019 | 5/1984 | United Kingdom | 439/77 |

Primary Examiner—Gil Weidenfeld
Assistant Examiner—P. Austin Bradley
Attorney, Agent, or Firm—Wenderoth, Lind & Ponack

[57] ABSTRACT

A flexible printed circuit board terminal structure includes a flexible printed circuit board composed of electrically conductive patterns formed on a flexible insulative film of a thermoplastic synthetic resin by the screen-printing of an electrically conductive coating, and an insulative coating of synthetic resin disposed on the insulative film on a portion thereof except for a terminal section defined at one edge. Metallic terminal members are placed on the electrically conductive patterns at the printed circuit board terminal section directly or through the intermediary of an electrically conductive adhesive, a terminal fixing film made of a thermoplastic synthetic resin having the same properties as the thermoplastic insulative film is placed on the terminal section from above the metallic terminal members, and predetermined portions of the thermoplastic insulative film and terminal fixing film, with the exception of portions at which the metallic terminal members are situated, are thermally fused.

12 Claims, 3 Drawing Sheets

FLEXIBLE PRINTED CIRCUIT BOARD TERMINAL STRUCTURE

BACKGROUND OF THE INVENTION

1. Field of the Invention

This invention relates to a terminal structure of a flexible printed circuit board of the type having electrically conductive patterns formed on a thermoplastic insulative film.

2. Prior Art

Much progress has been made recently in reducing the size and thickness of electronic components used in electronic devices. Flexible printed circuit boards for mounting these components are widely employed since they are very useful in terms of utilizing space effectively. Specifically, flexible printed circuit boards are widely used in the construction of membrane switches, flat cables and the like.

A flexible printed circuit board of the aforementioned kind basically comprises a flexible insulative film and electrically conductive patterns formed on the film. Flexible printed circuit boards in general use include the following two types:

(1) a flexible printed circuit board comprising a substrate obtained by affixing a copper foil to a polyimide film, and electrically conductive patterns formed on the substrate by an etching process and (2) a flexible printed circuit board comprising a polyester insulative film and electrically conductive patterns formed on the film by the screen printing therein of an electrically conductive paste such as silver paste.

The flexible printed circuit board of type (1) is disadvantageous in that a high cost is involved in the manufacturing process, which entails affixing the copper foil to the polyimide film having a high heat resistance and etching away the film to form the conductive patterns. To reduce the cost, the general practice is to employ the cheaper polyester film used in the flexible printed circuit board of type (2).

Since the polyimide film used in the flexible printed circuit board of type (1) is heat resistant, metallic terminal members which will form the terminals of the board are generally are soldered onto the conductive patterns at a terminal section. However, polyester film has comparatively little resistance to heat, so the metallic terminal members cannot be directly soldered onto the conductive patterns at the terminal sections. For this reason, an arrangement of the type shown in FIG. 9 is ordinarily is employed. Here, the terminal section of a flexible printed circuit board 72 is clamped by a connector 71 having terminals 73, and contacts connected to the terminals 73 inside the connector 71 are brought into pressured contact with the conductive patterns at the terminal section. The terminals 73 thus serve as the terminals of the flexible printed circuit board 72. An alternative method is to mechanically press the terminal section of the flexible printed circuit board into pressured contact with the electrodes of an electronic component to effect a direct connection with the terminal section.

The arrangement shown in FIG. 9 has certain drawbacks. Specifically, the connector 71 for clamping the terminal section of the flexible printed circuit board 72 occupies a large amount of space and therefore is an obstacle to a further reduction in size and thickness. The connector 71 also is costly.

Accordingly, if the metallic terminal members are electrically or mechanically fixed to the terminal section of the flexible printed circuit board of type (2) using the polyester film, the connector may be dispensed with, solder can be applied to the metallic terminal members and the arrangement will occupy less space than that using the connector 71. Though several methods of securing the metallic terminal members are available, all of them have certain shortcomings.

Specifically, one method is to connect the metallic terminal section by using an electrically conductive adhesive of, for example, the hot-melt type. However, such a connection has little mechanical strength and must be reinforced. Though the connection can be reinforced by hardening it with an insulative bonding agent, this approach is laborious and costly.

The method of mechanically bringing the terminal section of the flexible printed circuit board into mechanical pressured contact with the electrode portions of electronic components involves difficulties in terms of assuring a reliable connection between the contacting surfaces of the conductive patterns at the terminal section and the electrode portions of the electronic components. Also the connection between the contacting surfaces is adversely affected by flux build-up when solder is applied to the electrode portions.

SUMMARY OF THE INVENTION

Accordingly, an object of the present invention is to provide a flexible printed circuit board terminal structure having highly reliable electrical connections and strong mechanical connections in which metallic terminal members forming the terminals of the circuit board are directly connected to the terminal section of an electrically conductive pattern on a flexible printed circuit board the substrate of which is an insulative film made of a thermoplastic synthetic resin having little thermal resistance, such as polyester.

In accordance with the invention, the foregoing object is attained by providing a flexible printed circuit board terminal structure in which a flexible printed circuit board is constructed by forming electrically conductive patterns on a flexible insulative film made of a thermoplastic synthetic resin by the screen-printing thereon of an electrically conductive coating, and by the application of an insulative coating made of synthetic resin to the insulative film on a portion thereof excluding a terminal section. Metallic terminal members are placed on the electrically conductive patterns at the printed circuit board terminal section directly or through the intermediary of an electrically conductive adhesive. A terminal fixing film made of a thermoplastic synthetic resin having the same properties as the thermoplastic insulative film is placed on the terminal section from above the metallic terminal members, and predetermined portions of the thermoplastic insulative film and terminal fixing film, with the exception of portions at which the metallic terminal members are situated, are thermally fused. The metallic terminal members and the electrically conductive pattern can also be connected by electrically conductive adhesive such as a hot-melt type adhesive. In order to provide the metallic terminal members with even greater tensile strength( projections are formed on the sides of the terminal members.

Thus, in accordance with the invention, the metallic terminal members forming the terminals of the circuit board are brought directly into pressured contact with the electrically conductive patterns by the terminal fixing film fused on the terminal section of the circuit board. Accordingly, since the thickness of the circuit board terminal portion is equivalent to the sum of the circuit board thickness, terminal member thickness and terminal fixing film thickness, the resulting terminal structure is extremely thin. The aforementioned pressured contact between the terminal members and electrical conductive film via the terminal fixing film also serves to raise the strength with which the terminal members are secured. Furthermore, if the metallic terminal members are bonded to the electrically conductive patterns by the electrically conductive adhesive even greater strength can be obtained. If the projections are formed on the sides of the metallic terminal members, moreover, the projections will be anchored by the fused segments between the insulative film and terminal fixing film, thereby raising the tensile strength of the terminal members.

Other features and advantages of the present invention will be apparent from the following description taken in conjunction with the accompanying drawings, in which like reference characters designate the same or similar parts throughout the figures thereof.

DESCRIPTION OF THE PREFERRED EMBODIMENT

A preferred embodiment of the invention will now be described with reference to the drawings.

Figure 1:
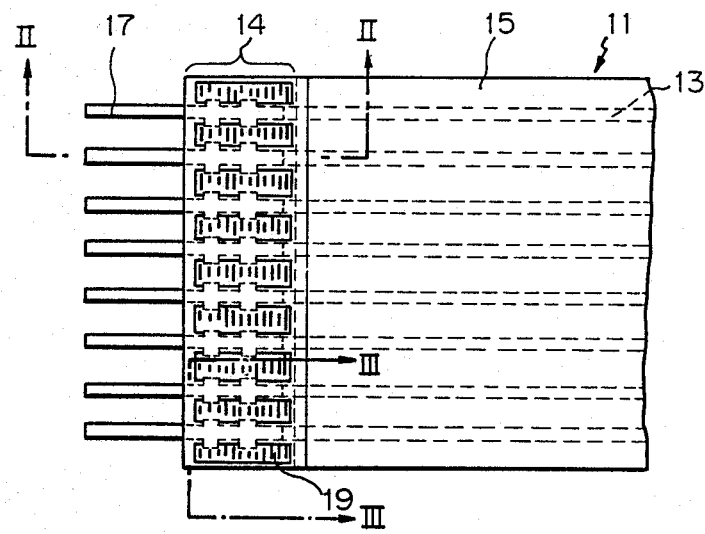
FIG. 1 is a partial plan view illustrating a terminal structure of a flexible printed circuit board in accordance with the present invention.
Figure 4:
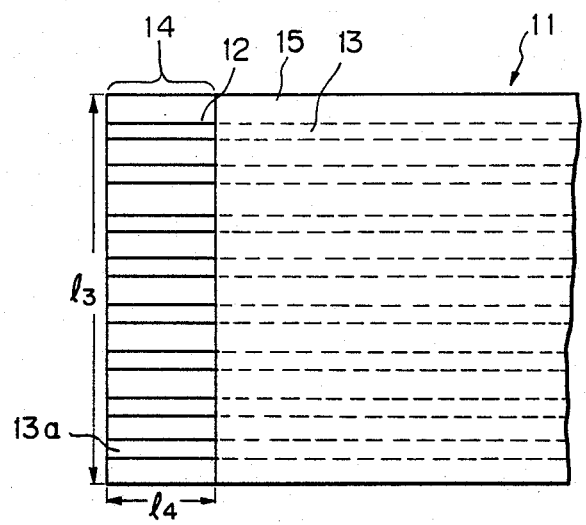
FIG. 4 is a partial plan view of a flexible printed circuit board.

FIG. 1 illustrates the terminal structure of a flexible printed circuit board according to the present invention. As shown in FIG. 4, a flexible printed circuit board 11 includes a flexible insulative film 12 made of a thermoplastic synthetic resin such as polyester, electrically conductive patterns 13 formed on the flexible insulative film 12 by screen printing electrically conductive coating such as silver paste, and an insulative coating 15 of synthetic resin applied to the insulative film 12 on a portion thereof excluding a terminal section 14.

Figure 2:
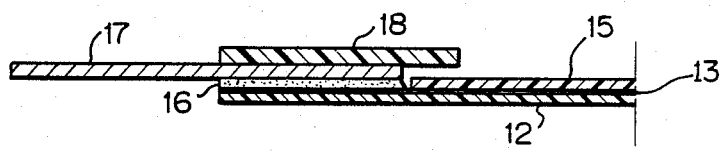
FIG. 2 is an enlarged sectional view taken along line II—II of FIG. 1.
Figure 3A:
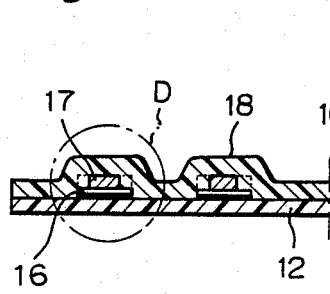
FIG. 3(a) is an enlarged sectional view taken along line III—III of FIG. 1.
Figure 3B:
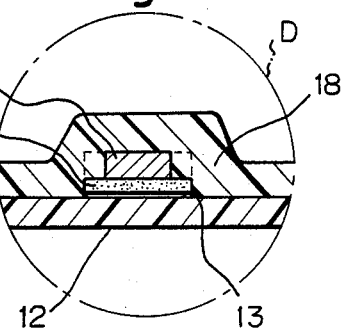
FIG. 3(b) is a partial enlarged sectional view showing the details of a portion enclosed by a circle D in FIG. 3(a)

As shown in FIGS. 1 through 3, the terminal structure of the flexible printed circuit board according to the invention includes metallic terminal members 17 placed on the electrically conductive patterns 13, which are formed on the terminal section 14 of insulative film 12, directly or through the intermediary of a hot-melt type electrically conductive adhesive layer 16. The terminal structure further includes a terminal fixing film 18, which is made of a thermoplastic synthetic resin having the same characteristics as the insulative film 12 of polyester or the like, placed on the terminal members 17. The insulative film 12 and the terminal fixing film 18 are fused to form fused segments 19 at predetermined portions of the terminal section 14 with the exception of the portions at which the metallic terminal members 17 are situated, whereby the terminal members 17 are sandwiched between the insulative film 12 and terminal fixing film 18. If the hot-melt type electrically conductive adhesive layer 16 is used, the layer 16 is melted to form a connection between the terminal members 17 and the corresponding electrically conductive patterns 13a at the terminal section 14. The process for manufacturing this flexible printed circuit board terminal structure will be described hereinbelow in detail.

Figure 5:
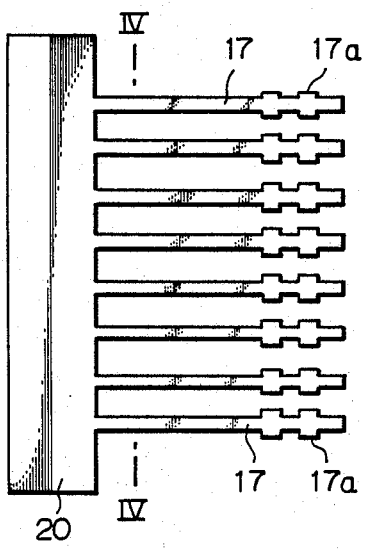
FIG. 5 is a plan view illustrating metallic terminal members.

As shown in FIG. 5, the plurality of metallic terminal members 17 are formed integral with a base 20 by means of sheet metal working. A plurality of projections 17a are formed on both sides of each metallic terminal member 17, though it will suffice if the projections 17a are formed on only one side or if only a single projection is formed rather than a plurality thereof.

Figure 6:
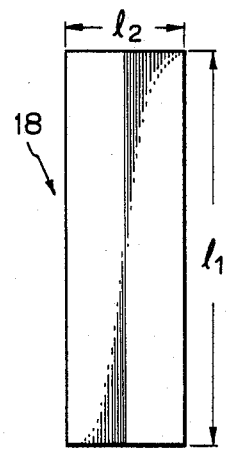
FIG. 6 is a plan view illustrating a terminal fixing film.

The terminal fixing film 18 consists of a thermoplastic synthetic resin film having the same characteristics as the insulative film 12 made of polyester or the like. In a preferred embodiment, as illustrated in FIG. 6, the terminal fixing film 18 is formed to have a width $l_1$ approximately equal to the width $l_3$ of the flexible printed circuit board 11, and a length $l_2$ slightly greater than the length $l_4$ of the terminal section 14. However, these dimensions of the terminal fixing film 18 are not limited to those illustrated. For example, the width $l_1$ can be made greater than that mentioned above. Then, after the insulative film 12 and terminal fixing film 18 are fused together, the portions of the film 18 protruding from the terminal section 14 can be cut off. The electrically conductive adhesive layer 16 is formed by screen printing the hot-melt type electrically conductive adhesive on the electrically conductive patterns 13, followed by heating the adhesive and allowing it to dry.

Figure 7:
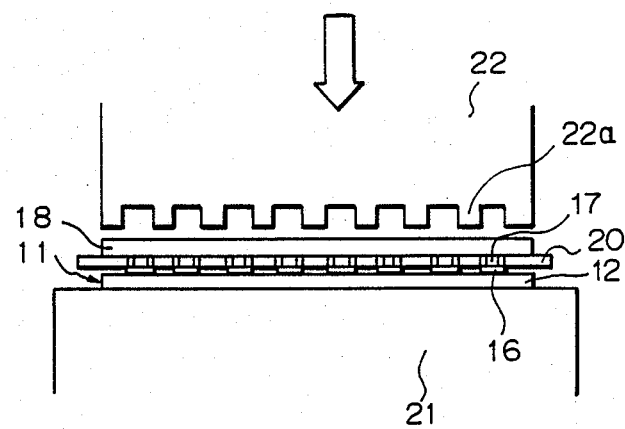
FIGS. 7 and 8 are schematic diagrams illustrating a process for manufacturing the flexible printed circuit board terminal structure of the invention.

As shown in FIG. 7, the metallic terminal members 17 integral with the base 20 are placed on corresponding ones of the electrically conductive patterns 13 on the surface of the flexible electrically insulative film 12 directly or through the intermediary of the electrically conductive adhesive layer 16, and the terminal fixing film 18 is placed on the terminal members 17. Under these conditions, a horn 22 for emitting ultrasonic waves is set on the terminal fixing film 18. The distal end of the horn 22 includes projections 22a which contact the terminal fixing film 18 at the portions of the terminal section 14 other than those where metallic terminal members 17 are located. These projections 22a are brought into contact with the terminal fixing film 18 at the aforementioned portions, at which time the horn 22 is actuated to emit ultrasonic waves that produce ultrasonic heating, whereby the insulative film 12 and terminal fixing film 18 are melted at the portions where the projections 22a are located. Since the insulative film 12 and terminal fixing film 18 are films each consisting of a thermoplastic synthetic resin, the films 12 and 18 are fused together. As a result, the fused segments 19 are formed at predetermined portions of the terminal section 14 other than those at which the metallic terminal members 17 are located, as shown in FIG. 1, and the portions of the terminal fixing film 18 where the recesses of the horn 22 are located are melted. When the melted and fused portions cool, forces produced by the contraction of the films 12, 18 cause the metallic terminal members 17 to be strongly and firmly embraced by these films. At this time, the projections 17a (FIG. 5) formed on both sides of the metallic terminal members 17 are anchored by the fused segments 19 (FIG. 1), so that the terminal members 17 will not readily be dislodged or detached even when they are pulled.

Figure 8:
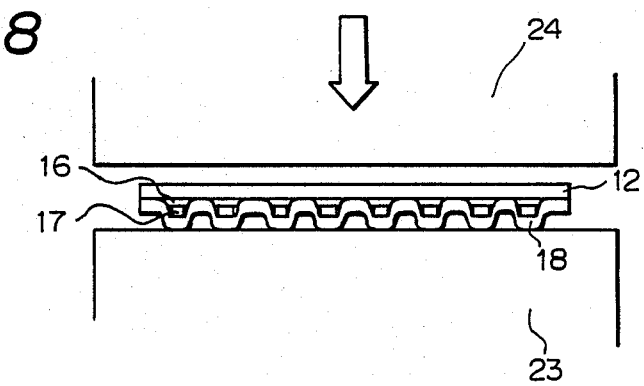

If the hot-melt type electrically conductive adhesive is used, the structure in which the metallic terminal members 17 have been fixedly secured by fusing the terminal fixing film 18 onto the terminal section 14 of the insulative film 12 is placed on a base 23, as shown in FIG. 8, and the structure is pressed from above by a heating iron 24 heated to a predetermined temperature. This melts the hot-melt type electrically conductive adhesive constituting the electrically conductive adhesive layer 16, whereby the metallic terminal members 17 and electrically conductive patterns 13a in the terminal section 14 are electrically and mechanically connected.

Finally, the metallic terminal members 17 are cut along the line IV—IV in FIG. 5 to separate them from the base 20, which is removed. This provides the plurality of discrete terminal members 17, the distal end of each of which projects outwardly from the terminal section 14 of insulative film 12 by a predetermined distance. This completes the manufacture of the terminal structure for the flexible printed circuit board according to the present invention.

In the embodiment described above, the electrically conductive adhesive layer 16 is formed on the electrically conductive patterns 13a located at the terminal section 14. However, even greater bonding strength can be obtained if an electrically conductive adhesive layer is also formed on portions of the metallic terminal members 17 connected to the electrically conductive patterns 13a and the hot-melt type adhesive forming these electrically conductive adhesive layers is melted.

Furthermore, in the foregoing embodiment, it is set forth that the metallic terminal members 17 and electrically conductive patterns 13a in the terminal section 14 can be bonded together by the hot-melt type electrically conductive adhesive. However, this adhesive bonding is not absolutely required. Since the metallic terminal members 17 are firmly embraced and secured by the insulative film 12 and terminal fixing film 18, the terminal structure has greater mechanical strength in comparison with the prior art even if the electrically conductive adhesive is not used.

In addition( it has been described that the projections 17a formed on the sides of the metallic terminal members 17 are anchored by the fused segments 19 and thereby act to increase tensile strength. However, the projections 17a are not essential. In particular, if the metallic terminal members 17 and corresponding electrically conductive patterns 13a are interconnected by the hot-melt type electrically conductive adhesive, tensile strength is not sacrificed significantly by foregoing the formation of the projections 17a.

In the above-described embodiment, ultrasonic heating is employed to fuse the insulative film 12 and terminal fixing film 18. However, as long as means are provided for heating and fusing the predetermined portions of the terminal section 14 except at the locations at which the metallic terminal members 17 are disposed, such means is not limited to the ultrasonic heating arrangement.

Figure 9:
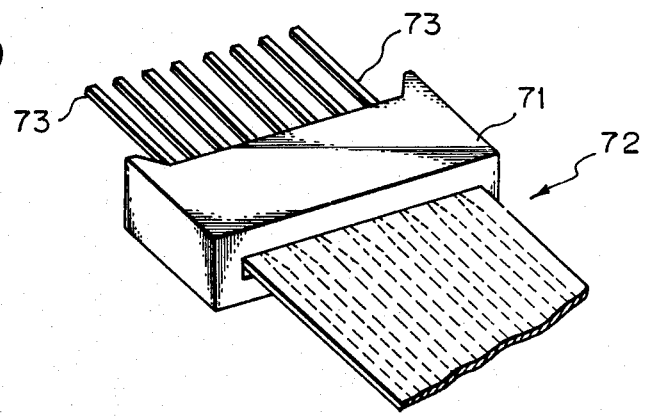
FIG. 9 is a partial perspective view of a flexible printed circuit board terminal structure according to the prior art.

Unlike the terminal structure using the connector 71 of the kind shown in FIG. 9, the flexible printed circuit board terminal structure described above readily lends itself to automated manufacture. Moreover, by forming the projections and recesses on the contact surface of the ultrasonic horn 22, the thermoplastic synthetic resins of the insulative film 12 and terminal fixing film 18 at the aforementioned contact surface are melted and allowed to cool, whereupon the metallic terminal members 17 are brought into firm pressured contact with and fixed to the corresponding electrically conductive patterns 13a at the terminal section 14. This makes it possible to achieve stable electrical connections and excellent tensile strength even if the hot-melt type electrically conductive adhesive is not used to bond the metallic terminal members 17 to the corresponding electrically conductive patterns 13a.

Since the metallic terminal members 17 project outwardly a predetermined distance beyond the terminal section of the completed flexible printed circuit board, other electronic components can be soldered to them irrespective of the obverse and reverse sides of the flexible printed circuit board. Moreover, if the flexible printed circuit board is to be connected to another circuit board, the connection can be achieved merely by plugging the end portions of the terminal members 17 into the corresponding holes of the other printed circuit board and then soldering the joints.

It should be noted that the flexible printed circuit board mentioned in the present invention refers to any obtained by forming electrically conductive patterns on the surface of a thermoplastic synthetic resin film by screen printing or the like. One example covered by such an arrangement is a flat cable.

The present invention described hereinabove has the following advantages:

(1) Since the metallic terminal members constituting the terminals are secured and brought into firm pressured contact directly with the electrically conductive patterns by means of the terminal fixing film fused on the terminal section of the flexible printed circuit board, the thickness of the terminal section is very small, namely the equivalent of the sum of the circuit board thickness, the thickness of the metallic terminal members and the thickness of the terminal fixing film. Furthermore, the terminal structure exhibits great mechanical strength and a highly reliable electrical connection and conforms to the trend toward smaller, thinner electronic components.

(2) The strength of the terminal section is enhanced even further if the metallic terminal members and electrically conductive patterns are bonded together by the electrically conductive adhesive.

(3) If the projections are formed on the sides of the metallic terminal members( these will be imbedded in and engage with the segments where the insulative film and terminal fixing film are fused together, thereby providing the metallic terminal members with even greater tensile strength.

As many apparently widely different embodiments of the present invention can be made without departing from the spirit and scope thereof, it is to be understood that the invention is not limited to the specific embodiments thereof except as defined in the appended claims.

What is claimed is:

1. A terminal structure comprising:

a flexible printed circuit board including an electrically insulative film on which a terminal area is defined at one portion thereof and a predetermined area is defined at another portion thereof adjacent said terminal portion, and an electric conductor pattern disposed on said film at said terminal area and at said predetermined area, said electrically insulative film comprising thermoplastic synthetic resin and said electric conductor pattern comprising solidified electrically conductive paste;

an electrically insulative coating comprising a synthetic resin disposed on said electrically insulative film covering only the portion of the electric conductor pattern disposed at said predetermined area;

metallic terminal members disposed over respective portions of said electric conductor pattern at said terminal area, said metallic terminal members also extending a predetermined distance from said terminal area;

a terminal fixing film comprising an electrically insulative thermoplastic synthetic resin disposed at said terminal area over said metallic terminal members, said terminal fixing film fixing said metallic terminal members relative to said printed circuit board and over said respective portions of said electric conductor pattern; and fusion bonded portions at which said terminal fixing film is fusion bonded to said electrically insulative film of said printed circuit board being located at said terminal area adjacent locations at which said metallic terminal members are disposed over the respective portions said, electric conductor pattern.

2. A terminal structure as claimed in claim 1, wherein a hot-melt type electrically conductive adhesive is disposed between the respective portions of said electric conductor pattern and said metallic terminal members, said electrically conductive adhesive fixing and operatively electrically connecting said metallic terminal members to the respective portions of said electric conductor pattern.

3. A terminal structure as claimed in claim 1, wherein each of said metallic terminal members has opposite edge portions defined thereon within said terminal area, and at least one projection extending from at least one of said edge portions thereof.

4. A terminal structure as claimed in claim 3 wherein a hot-melt type electrically conductive adhesive is disposed between the respective portions of said electric conductor pattern and said metallic terminal members, said electrically conductive adhesive fixing and operatively electrically connecting said metallic terminal members to the respective portions of said electric conductor pattern.

5. A terminal structure comprising:

a flexible printed circuit board including an electrically insulative film on which a terminal area is defined at one portion thereof and a predetermined area is defined at another portion thereof adjacent said terminal portion, and an electric conductor pattern disposed on said film at said terminal area and at said predetermined area, said electrically insulative film comprising a thermoplastic synthetic resin of polyester and said electrical conductor pattern comprises solidified electrically conductive paste;

an electrically insulative coating comprising a synthetic resin disposed on said electrically insulative film covering only the portion of the electric conductor pattern disposed at said predetermined area;

metallic terminal members disposed over respective portions of said electric conductor pattern at said terminal area, said metallic terminal members also extending a predetermined distance from said terminal area; and a terminal fixing film comprising thermoplastic polyester disposed at said terminal area over said metallic terminal members, said terminal fixing film fixing said metallic terminal members relative to said printed circuit board and over said respective portions of said electric conductor pattern; and fusion bonded portions at which said terminal fixing film is fusion bonded to said electrically insulative film of said printed circuit board being located at said terminal area adjacent locations at which said metallic terminal members are disposed over the respective portions of said electric conductor pattern.

6. A terminal structure as claimed in claim 5, wherein a hot-melt type electrically conductive adhesive is disposed between the respective portions of said electric conductor pattern and said metallic terminal members, said electrically conductive adhesive fixing and operatively electrically connecting said metallic terminal members to the respective portions of said electric conductor pattern.

7. A terminal structure as claimed in claim 5, wherein each of said metallic terminal members has opposite edge portions defined thereon within said terminal area, and at least one projection extending from at least one of said edge portions thereof.

8. A terminal structure as claimed in claim 7, wherein a hot-melt type electrically conductive adhesive is disposed between the respective portions of said electric conductor pattern and said metallic terminal members, said electrically conductive adhesive fixing and operatively electrically connecting said metallic terminal members to the respective portions of said electric conductor pattern.

9. A terminal structure comprising:

a flexible printed circuit board including an a thermoplastic synthetic resin film of polyester on which a terminal area is defined at one portion thereof and a predetermined area is defined at another portion thereof adjacent said terminal portion, and an electric conductor pattern disposed on said film at said terminal area and at said predetermined area, said electric conductor portion comprising solidified electrically conductive paste;

an electrically insulative coating comprising a synthetic resin disposed on said film covering only the portion of the electric conductor pattern disposed at said predetermined area;

metallic terminal members disposed over respective portions of said electric conductor pattern at said terminal area, said metallic terminal members also extending a predetermined distance from said terminal area;

a terminal fixing film comprising a thermoplastic synthetic resin of polyester disposed at said terminal area over said metallic terminal members, said terminal fixing film fixing said metallic terminal members relative to said printed circuit board and over said respective portions of said electric conductor pattern;

fusion bonded portions at which said terminal fixing film is fusion bonded to said polyester film of said printed circuit board being located at said terminal area adjacent locations at which said metallic terminal members are disposed over the respective portions of said electric conductor pattern; and a hot-melt type electrically conductive adhesive disposed between the respective portions of said electric conductor pattern and said metallic terminal members, said electrically conductive adhesive fixing and operatively electrically connecting said metallic terminal members to the respective portions of said electric conductor pattern.

10. A terminal structure as claimed in claim 9, wherein each of said metallic terminal members has opposite edge portions defined thereon within said terminal area, and at least one projection extending from at least one of said edge portions thereof.

11. A terminal structure comprising:

a flexible printed circuit board including a film at which a terminal area is defined on one portion thereof and a predetermined area is defined at another portion thereof adjacent said terminal area, and an electric conductor pattern disposed on said film at said terminal area and at said predetermined area;

said electrically insulative film comprising a thermoplastic synthetic resin of polyester, and said electric conductor pattern comprising solidified electrically conductive paste;

an electrically insulating coating comprising synthetic resin disposed on said film covering only the portion of said electric conductor pattern disposed at said predetermined area;

metallic terminal members disposed over respective portions of said electric conductor pattern at said terminal area, said metallic terminal members also extending a predetermined distance from said terminal area;

a terminal fixing film comprising a thermoplastic film of polyester disposed at said terminal area over said metallic terminal members, said terminal fixing film fixing said metallic terminal members relative to said printed circuit board and over said respective portions of said electric conductor pattern;

fusion bonded portions at which said terminal fixing film is fusion bonded to said film of said printed circuit board being located at said terminal area between locations at which said metallic terminal members are disposed over the respective portions of said electric conductor portions and at outermost edge portions of said terminal area; and a hot-melt type electrically conductive adhesive disposed between the respective portions of said electric conductor pattern and said metallic terminal members, said electrically conductive adhesive fixing and operatively electrically connecting said metallic terminal members to the respective portions of said electric conductor pattern.

12. A terminal structure as claimed in claim 11, wherein each of said metallic terminal members has opposite edge portions defined thereon within said terminal area, and at least one projection extending from at least one of said edge portions thereof.

* * * * *